United States Patent [19]
Ramdani et al.

[11] Patent Number: 5,741,724
[45] Date of Patent: Apr. 21, 1998

[54] METHOD OF GROWING GALLIUM NITRIDE ON A SPINEL SUBSTRATE

[75] Inventors: Jamal Ramdani, Gilbert; Michael S. Lebby, Apache Junction; Paige M. Holm, Phoenix, all of Ariz.

[73] Assignee: Motorola, Schaumburg, Ill.

[21] Appl. No.: 774,819

[22] Filed: Dec. 27, 1996

[51] Int. Cl.$^6$ .................. H01L 21/20; H01L 21/203; H01L 21/205
[52] U.S. Cl. ............................. 437/128; 437/129
[58] Field of Search .................. 437/126, 128, 437/129, 127

[56] References Cited

U.S. PATENT DOCUMENTS

| | | | |
|---|---|---|---|
| 4,769,341 | 9/1988 | Luryi | 437/128 |
| 5,448,084 | 9/1995 | Hoke et al. | 257/190 |
| 5,530,267 | 6/1996 | Brandle, Jr. et al. | 257/76 |

*Primary Examiner*—Brian Dutton
*Attorney, Agent, or Firm*—Eugene A. Parsons

[57] ABSTRACT

A method of growing gallium nitride on a spinel substrate by providing a supporting substrate having a surface, and disposing a plurality of buffer layers on the surface of the supporting substrate. The plurality of buffer layers including a first buffer layer of aluminum oxynitride having a low percentage of mismatch to the spinel substrate. The second buffer layer is disposed on the first buffer layer and includes a plurality of layers of a graded aluminum oxynitride having a low dislocation density. A third buffer layer of aluminum nitride is disposed on the second buffer layer. A fourth buffer layer of gallium nitride is disposed on the third buffer layer. Subsequently, a photonic device structure, such as a laser, LED or detector, an electronic device structure, such as a field effect transistor or modulation doped field effect transistor, or an optical waveguide is fabricated on the fourth buffer layer.

22 Claims, 1 Drawing Sheet

METHOD OF GROWING GALLIUM NITRIDE ON A SPINEL SUBSTRATE

FIELD OF THE INVENTION

The present invention pertains to the fabrication of gallium nitride based devices on a supporting substrate, more particularly the fabrication of a gallium nitride based device on a spinel substrate element.

BACKGROUND OF THE INVENTION

Gallium nitride based devices, and devices which utilize its alloys, such as indium gallium aluminum nitride, are of great importance for application in ultraviolet/blue light emitting devices and for high power high temperature radio frequency applications. Typically, gallium nitride, and its alloys, are grown on a supporting substrate comprised of sapphire ($a-Al_2O_3$). Although gallium nitride is typically grown on sapphire substrates, there exists a problem in that the lattice mismatch between gallium nitride and sapphire is about 14%. Recently a supporting substrate composed of $MgAl_2O_4$, more commonly referred to as a spinel substrate material, has attracted a great amount of attention because of its smaller lattice mismatch. It is reported that the spinel material has a 9% lattice mismatch to gallium nitride. In addition, unlike sapphire, spinel is cubic and can be cleaved for mirror facet formation.

While the lattice mismatch is decreased when utilizing a spinel substrate, relative to sapphire, it remains relatively high. In addition, the reported dislocation density of gallium nitride when grown on a sapphire substrate is approximately $10E9/cm^2$. An advantage to using a spinel substrate is that a lower dislocation density can be achieved when the spinel substrate is utilized.

At present, high brightness blue/green LEDs, and gallium nitride/aluminum gallium nitride MODFETs with a sheet carrier density of up to $10E13/cm^2$ and mobility of about 1000 $cm^2/v.s$ have been reported. In comparison, gallium nitride based laser diodes and high mobility MODFETs have yet to be achieved. It is believed that a method of growing gallium nitride material and its alloys on a spinal substrate that provides for a further reduction in the percentage of lattice mismatch and dislocation density will have a great impact on the optical and electrical properties of gallium nitride based devices.

Accordingly, there exist a need for a method of growing gallium nitride on a substrate, that would achieve a lower percentage of lattice mismatch and dislocation density.

It is a purpose of the present invention to provide for a new and improved method of growing gallium nitride on a spinel substrate.

It is a still further purpose of the present invention to provide for a method of growing gallium nitride on a spinel substrate utilizing a plurality of buffer layers that will further aid in the reduction of the percentage of lattice mismatch relative to the spinel substrate.

It is yet another purpose of the present invention to provide for a method of growing gallium nitride on a spinel substrate that will result in a reduced dislocation density.

It is a further purpose of the present invention to provide for a method of growing gallium nitride on a spinel substrate with improved reliability and reduced manufacturing costs.

SUMMARY OF THE INVENTION

The above problems and others are substantially solved and the above purposes and others are realized in a method of growing gallium nitride on a substrate including the steps of providing a supporting substrate having a surface. Disposed on the surface of the supporting substrate are a plurality of buffer layers. The buffer layers include layers of materials such as aluminum oxynitride, graded aluminum oxynitride, aluminum nitride and gallium nitride. Once fabricated, a photonic device structure, electronic device structure, or an optical waveguide structure is fabricated on the surface of the plurality of buffer layers.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
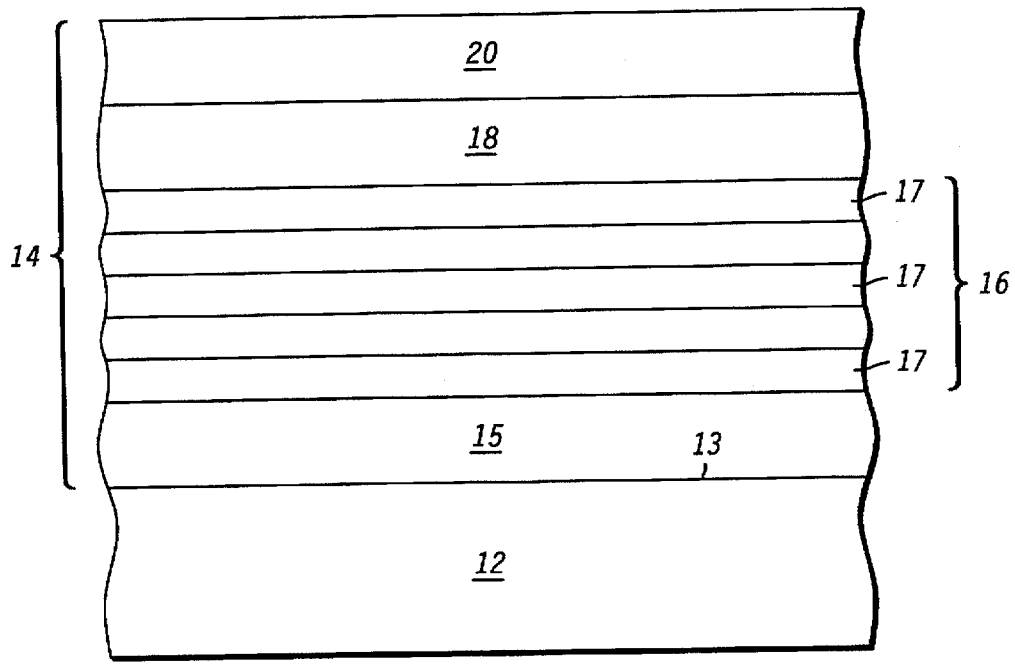
FIGS. 1 and 2 illustrate various stages of development of a gallium nitride based device structure having a gallium nitride material grown on a substrate element in accordance with the method of the present invention.
Figure 2:
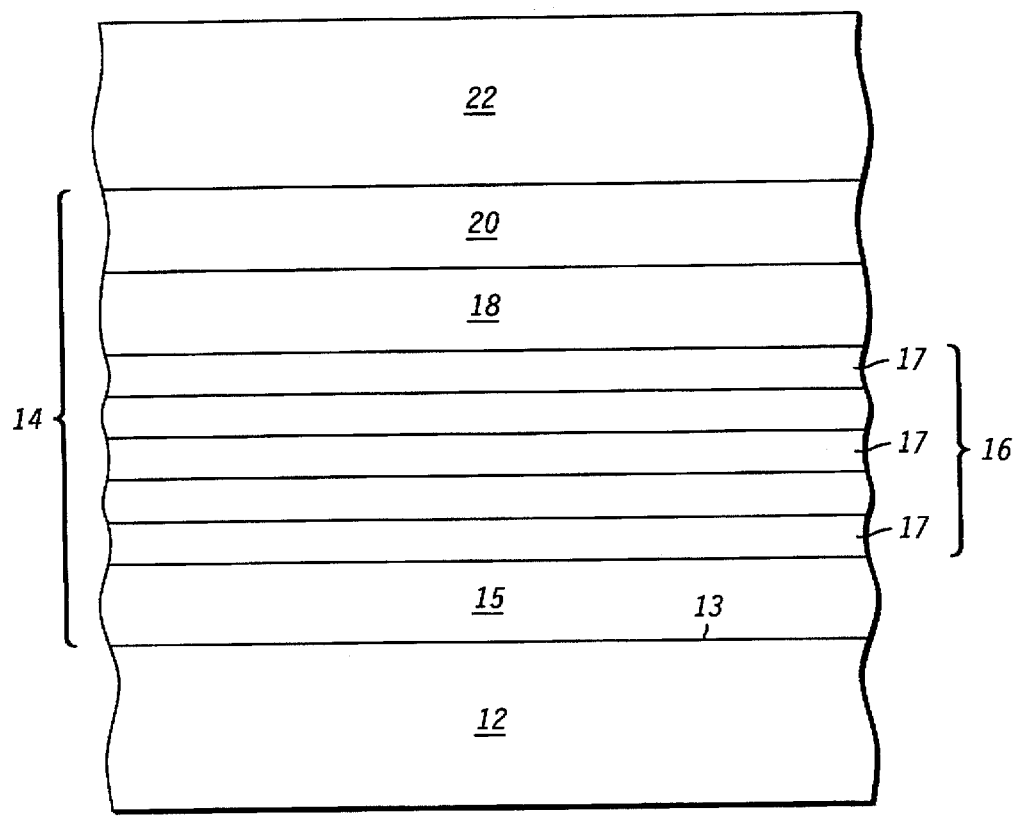

Referring to the figures and specifically to FIG. 1, initial steps in the formation of a gallium nitride based device 10 in accordance with the present invention are illustrated. A substrate 12 of a suitable material for forming the various layers comprising the gallium nitride based device 10 is provided. Generally, gallium nitride based device 10 is made of several defined areas or regions, such as a plurality of buffer layers 14, including a first buffer layer 15, a second buffer layer 16, composed of a plurality of layers, a third buffer layer 18 and a fourth buffer layer 20. There is disposed on top of fourth buffer layer 20 one of a photonic device structure, an electronic device structure, or an optical waveguide structure generally referenced as 22 (as shown in FIG. 2). More specifically, in combination, the plurality of buffer layers 14 provide for the fabrication of a high quality gallium nitride based material to be grown on a supporting substrate 12, while maintaining a low lattice mismatch and confining and reducing dislocation density.

Substrate 12, in this example, is a spinel substrate material, more particularly supporting substrate 12 is made of a magnesium aluminum oxide ($MgAl_2O_4$) material. Spinel substrate 12 is thereby capable of achieving a low lattice mismatch percentage with the gallium nitride materials included within buffer layers 14 and the photonic, electronic or optical waveguide device structure 22.

In order to dispose high quality gallium nitride materials on supporting substrate 12, more particularly the spinel supporting substrate, it is very critical to initiate a two dimensional coverage or growth at a surface 13 of spinel supporting substrate 12. To achieve this two dimensional growth of these highly mismatched materials, first buffer layer 15 is grown at a low temperature on spinel supporting substrate 12, and is capable of serving as a nucleation layer. First buffer layer 15 includes a thin 100–200 Å thick, single crystal aluminum oxynitride (ALON) material having 30 moles of AlN. First buffer layer 15 is grown on surface 13 of spinel supporting substrate 12 using MOCVD or any other suitable epitaxial growth process. Typically, any suitable epitaxial deposition method, such as molecular beam epitaxy (MBE), metal organic chemical vapor deposition (MOCVD), or the like is used to deposit the required multiple layered structures, such as first buffer layer 15.

second buffer layer 16, comprised of a plurality of layers 17, third buffer layer 18, fourth buffer layer 20, and device structure 22 of gallium nitride based device 10. Also, it should be understood that many of these layers are made of compound materials, such as aluminum oxynitride, graded aluminum oxynitride, aluminum nitride, gallium nitride, and indium gallium aluminum nitride. It should be understood that epitaxial deposition is used extensively to produce the multitude of layers that comprise the device 10.

As stated, first buffer layer 15 is generally comprised of aluminum oxynitride (ALON) and serves as a nucleation layer with spinel supporting substrate 12 of device structure 10. ALON is capable of reducing the dislocation density by orders of magnitude. ALON is a crystal made of aluminum oxide and aluminum nitride with different AlN mole fractions. For example, the lattice constant of ALON with 30 moles of aluminum nitride has less than a 1.5% lattice mismatch with spinel supporting substrate 12. It should be further understood that in the examples where a percent composition of a particular element is given it should be considered only as an example and that these variations from these examples can be large and are also part of the present invention. Typically, first buffer layer 15 is fabricated in the range of 100–200 Å thick and serves to facilitate epitaxial growth of the subsequent multiple layers that comprise the gallium nitride device structure 10.

Next, a second buffer layer 16, is grown on a surface of first buffer layer 15. Second buffer layer 16 includes the plurality of composition graded layers 17 of an aluminum oxynitride material. The thickness of second buffer layer 16, more particularly the plurality of graded layers 17, will be optimized for the lowest dislocation density. Accordingly, the aluminum nitride mole fraction will typically be increased in a linear or parabolic fashion. Second buffer layer 16 includes graded layers 17 of $ALON_x$ to pure AlN, by decreasing the oxygen content across the graded layers 17.

A third buffer layer 18 is positioned on a surface of second buffer layer 16. Third buffer layer 18 is typically comprised of an aluminum nitride material and is grown on the order of a few hundreds of Å thick. A fourth buffer layer 20 of gallium nitride is grown on the surface of third buffer layer 18. In combination, the plurality of buffer layers 15, 16, 18 and 20 serve to confine and reduce the dislocation density, thus allowing for a high quality gallium nitride based material to be grown on spinel substrate 12. It should be understood that the thickness and grading level of the plurality of buffer layers 14 must be precisely controlled. Any slight deviation to the designed parameters may affect the performance of the optical waveguide, photonic or electronic device structure 22 disposed on fourth buffer layer 20, and in addition will affect the final manufacturing yield.

Referring now to FIG. 2, illustrated is complete device structure 10 fabricated according to the method disclosed in the present invention. Illustrated is device structure 10 composed of spinel supporting substrate 12 and a plurality of buffer layers 14, more particularly, first buffer layer 15, second buffer layer 16, third buffer layer 18 and fourth buffer layer 20. Once the buffer layers 14 are grown, an indium gallium aluminum nitride photonic device structure, an electronic device structure, or an optical waveguide structure, generally referenced as 20, is disposed on the surface of fourth buffer layer 18. Photonic device structure 22 is disclosed as including the fabrication of a laser device structure, such as a vertical cavity surface emitting laser, a light emitting device structure, such as an organic or inorganic LED, a detector structure, such as that used to monitor laser emissions, or the like. Electronic device structure 22 is disclosed as including the fabrication of a field effect transistor structure, a modulation doped field effect transistor (MODFET) structure or high electron mobility transistor (HEMT) structure, a heterojunction field effect transistor (HFET) structure, or the like.

Accordingly, disclosed is a method of fabricating a high quality gallium nitride based material on a spinel substrate. The method of the present invention is fabricated by disposing a plurality of buffer layers on a spinel supporting substrate that provides for an approximate 1.5 percent lattice mismatch with the included gallium nitride materials. In addition, the spinel supporting substrate, in conjunction with the plurality of buffer layers provides for substantial confining and reducing of the dislocation density, thus allowing for the growth of a high quality gallium nitride material on the spinel substrate. The structure further includes the disposing of an indium gallium aluminum nitride photonic device structure, an electronic device structure, or an optical waveguide structure, on the surface of the plurality of buffer layers.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention fabricated according to the disclosed method, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of growing gallium nitride on a substrate comprising the steps of:

providing a supporting substrate having a surface;

disposing a plurality of buffer layers on the surface of the supporting substrate, the plurality of buffer layers including an aluminum oxynitride material, graded aluminum oxynitride, aluminum nitride and gallium nitride; and fabricating one of a photonic device structure, an electronic device structure and an optical waveguide structure on a surface of the plurality of buffer layers.

2. A method of growing gallium nitride on a substrate as claimed in claim 1 wherein the supporting substrate includes a magnesium aluminum oxide spinel substrate.

3. A method of growing gallium nitride on a substrate as claimed in claim 2 wherein the plurality of buffer layers includes a first buffer layer, a second buffer layer, a third buffer layer and a fourth buffer layer.

4. A method of growing gallium nitride on a substrate as claimed in claim 3 wherein the first buffer layer is a layer of aluminum oxynitride disposed on the surface of the supporting substrate.

5. A method of growing gallium nitride on a substrate as claimed in claim 4 wherein the second buffer layer is a plurality of layers of graded aluminum oxynitride disposed on the first buffer layer.

6. A method of growing gallium nitride on a substrate as claimed in claim 5 wherein the plurality of layers of graded aluminum oxynitride decrease in oxygen content across the plurality of layers.

7. A method of growing gallium nitride on a substrate as claimed in claim 5 wherein the third buffer layer is aluminum nitride disposed on the second buffer layer.

8. A method of growing gallium nitride on a substrate as claimed in claim 7 wherein the fourth buffer layer is gallium nitride disposed on the third buffer layer.

9. A method of growing gallium nitride on a substrate as claimed in claim 8 wherein the photonic device structure includes a laser device structure, a light emitting device structure, and a detector structure.

10. A method of growing gallium nitride on a substrate as claimed in claim 9 wherein the electronic device structure includes one of a field effect transistor structure, a modulation doped field effect transistor structure and a heterojunction field effect transistor structure.

11. A method of growing gallium nitride on a substrate comprising the steps of:

provding a magnesium aluminum oxide supporting substrate having a surface;

disposing a first buffer layer on the surface of the magnesium aluminum oxide supporting substrate;

disposing a second buffer layer on the first buffer layer, forming the second buffer layer to include a plurality of layers and disposing the plurality of layers adjacent the first buffer layer;

disposing a third buffer layer on the second buffer layer;

disposing a fourth buffer layer on the third buffer layer; and fabricating one of a photonic device structure, an electronic device structure, and an optical waveguide structure on the fourth buffer layer.

12. A method of growing gallium nitride on a substrate as claimed in claim 11 wherein the first buffer layer includes an aluminum oxynitride material.

13. A method of growing gallium nitride on a substrate as claimed in claim 12 wherein the aluminum oxynitride material includes 30 moles of a single crystal aluminum nitride, and having a lattice mismatch of less than 1.5% to the supporting substrate.

14. A method of growing gallium nitride on a substrate as claimed in claim 13 wherein the layer of aluminum oxynitride ranges between 100–200 Å thick.

15. A method of growing gallium nitride on a substrate as claimed in claim 14 wherein the plurality of layers of the second buffer layer include graded aluminum oxynitride, the graded aluminum oxynitride decreasing in oxygen content across the plurality of layers of the second buffer layer.

16. A method of growing gallium nitride on a substrate as claimed in claim 13 wherein the third buffer layer is an aluminum nitride material.

17. A method of growing gallium nitride on a substrate as claimed in claim 13 wherein the fourth buffer layer is a gallium nitride material.

18. A method of growing gallium nitride on a substrate comprising the steps of:

providing a magnesium aluminum oxide supporting substrate having a surface;

disposing a first buffer layer on the surface of the magnesium aluminum oxide supporting substrate, the first buffer layer including an aluminum oxynitride material;

disposing a second buffer layer on the first buffer layer, forming the second buffer layer to include a plurality of layers of graded aluminum oxynitride and disposing the plurality of layers of graded aluminum oxynitride adjacent the aluminum oxynitride material of the first buffer layer;

disposing a third buffer layer on the second buffer layer, the third buffer layer including an aluminum nitride material;

disposing a fourth buffer layer on the third buffer layer, the fourth buffer layer including a gallium nitride material; and fabricating one of a photonic device structure, an electronic device structure, and an optical waveguide structure on the gallium nitride material of the fourth buffer layer.

19. A method of growing gallium nitride on a substrate as claimed in claim 18 wherein the first buffer layer of an aluminum oxynitride material is formed as a single crystal and includes thirty moles of aluminum nitride.

20. A method of growing gallium nitride on a substrate as claimed in claim 19 wherein the first buffer layer of an aluminum oxynitride material is grown in a range of 100–200 Å thick.

21. A method of growing gallium nitride on a substrate as claimed in claim 20 wherein the first buffer layer of an aluminum oxynitride material is less than a 1.5% lattice mismatch to the magnesium aluminum oxide supporting substrate.

22. A method of growing gallium nitride on a substrate as claimed in claim 21 wherein the second buffer layer of graded aluminum oxynitride is fabricated to achieve a low dislocation density.

* * * * *